(12) United States Patent
Shifren et al.

(10) Patent No.: US 10,763,433 B2
(45) Date of Patent: Sep. 1, 2020

(54) ASYMMETRIC CORRELATED ELECTRON SWITCH OPERATION

(71) Applicant: Arm Limited, Cambridge (GB)

(72) Inventors: Lucian Shifren, San Jose, CA (US); Greg Yeric, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/284,901

(22) Filed: Feb. 25, 2019

(65) Prior Publication Data

US 2019/0189921 A1 Jun. 20, 2019

Related U.S. Application Data

(60) Division of application No. 15/681,236, filed on Aug. 18, 2017, now Pat. No. 10,217,937, which is a continuation of application No. 14/850,213, filed on Sep. 10, 2015, now Pat. No. 9,755,146.

(51) Int. Cl.
| | |
|---|---|
| *G11C 13/00* | (2006.01) |
| *H01L 49/00* | (2006.01) |
| *H01L 45/00* | (2006.01) |
| *G11C 7/20* | (2006.01) |

(52) U.S. Cl.
CPC .............. *H01L 49/003* (2013.01); *G11C 7/20* (2013.01); *G11C 13/0007* (2013.01); *G11C 13/0038* (2013.01); *G11C 13/0069* (2013.01); *H01L 45/04* (2013.01); *H01L 45/146* (2013.01); *H01L 45/1641* (2013.01); *G11C 2013/0073* (2013.01); *G11C 2213/15* (2013.01); *G11C 2213/73* (2013.01)

(58) Field of Classification Search
CPC ... G11C 7/20; G11C 13/0069; G11C 13/0038; G11C 13/0007; G11C 2213/15; G11C 2013/0073; G11C 2213/73; H01L 49/003; H01L 45/1641; H01L 45/146; H01L 45/04
See application file for complete search history.

(56) References Cited

U.S. PATENT DOCUMENTS

| | | |
|---|---|---|
| 6,466,489 B1 | 10/2002 | Ieong |
| 7,298,640 B2 | 11/2007 | Chen et al. |
| 7,639,523 B2 | 12/2009 | Celinska et al. |
| 7,778,063 B2 | 8/2010 | Brubaker et al. |
| 7,872,900 B2 | 1/2011 | Paz de Araujo et al. |
| 9,514,814 B1 | 12/2016 | Sandhu et al. |
| 9,548,118 B1 | 1/2017 | Bhavnagarwala et al. |
| 9,558,819 B1 | 1/2017 | Aitken et al. |

(Continued)

FOREIGN PATENT DOCUMENTS

| | | |
|---|---|---|
| WO | 2009140305 A1 | 11/2009 |
| WO | 20090140305 A1 | 11/2009 |

(Continued)

OTHER PUBLICATIONS

U.S. Appl. No. 15/681,236 / Application and Preliminary Amendment, filed Aug. 18, 2017, 67 pages.

(Continued)

*Primary Examiner* — Khamdan N. Alrobaie
(74) *Attorney, Agent, or Firm* — Berkeley Law & Technology Group, LLP

(57) ABSTRACT

Subject matter disclosed herein may relate to correlated electron switches that are capable of asymmetric set or reset operations.

15 Claims, 8 Drawing Sheets

(56) References Cited

U.S. PATENT DOCUMENTS

| | | | |
|---|---|---|---|
| 9,584,118 | B1 | 2/2017 | Dao et al. |
| 9,589,636 | B1 | 3/2017 | Bhavnagarwala et al. |
| 9,621,161 | B1 | 4/2017 | Das et al. |
| 9,627,615 | B1 | 4/2017 | Reid et al. |
| 9,660,189 | B1 | 5/2017 | Reid et al. |
| 9,734,895 | B2 | 8/2017 | Savanth et al. |
| 9,735,360 | B2 | 8/2017 | Shifren et al. |
| 9,735,766 | B2 | 8/2017 | Shifren |
| 9,747,982 | B1 | 8/2017 | Shifren et al. |
| 9,748,943 | B2 | 8/2017 | Sandhu et al. |
| 9,755,146 | B2 | 9/2017 | Shifren et al. |
| 9,773,550 | B2 | 9/2017 | Bhavnagarwala et al. |
| 9,947,402 | B1* | 4/2018 | Bhavnagarwala ... G11C 13/004 |
| 10,217,937 | B2 | 2/2019 | Shifren |
| 2004/0100817 | A1 | 5/2004 | Subramanian |
| 2008/0106926 | A1* | 5/2008 | Brubaker ............ H01L 27/2409 |
| | | | 365/148 |
| 2008/0106927 | A1 | 5/2008 | Celinska |
| 2008/0107801 | A1* | 5/2008 | Celinska ................ H01L 45/04 |
| | | | 427/96.7 |
| 2009/0231083 | A1 | 9/2009 | Hosoi et al. |
| 2009/0296451 | A1 | 12/2009 | Asao |
| 2012/0217549 | A1 | 8/2012 | Widjaja |
| 2013/0094280 | A1 | 4/2013 | Widjaja |
| 2013/0285699 | A1 | 10/2013 | Williams et al. |
| 2014/0175603 | A1 | 6/2014 | Ananthan |
| 2015/0041751 | A1 | 2/2015 | Zhang |
| 2017/0033782 | A1* | 2/2017 | Shifren ............. G11C 13/0069 |
| 2017/0045905 | A1 | 2/2017 | Sandhu et al. |
| 2017/0047115 | A1 | 2/2017 | Aitken et al. |
| 2017/0047116 | A1 | 2/2017 | Sandhu et al. |
| 2017/0047919 | A1 | 2/2017 | Sandhu et al. |
| 2017/0069378 | A1* | 3/2017 | Shifren ............. G11C 13/0069 |
| 2017/0077400 | A1 | 3/2017 | Shifren et al. |
| 2017/0084331 | A1 | 3/2017 | Bhavnagarwala et al. |
| 2017/0092858 | A1 | 3/2017 | Shifren |
| 2017/0099049 | A1 | 4/2017 | Sandhu et al. |
| 2017/0103809 | A1 | 4/2017 | Bhavnagarwala et al. |
| 2017/0110191 | A1 | 4/2017 | Aitken et al. |
| 2017/0117043 | A1 | 4/2017 | Sandhu et al. |
| 2017/0147207 | A1 | 5/2017 | Hansson et al. |
| 2017/0178718 | A1 | 6/2017 | Savanth et al. |
| 2017/0178724 | A1 | 6/2017 | Bhavnagarwala et al. |
| 2017/0179385 | A1 | 6/2017 | Shifren et al. |
| 2017/0206963 | A1 | 6/2017 | Bhavnagarwala et al. |
| 2017/0207784 | A1 | 7/2017 | Das et al. |
| 2017/0213592 | A1 | 7/2017 | Bhavnagarwala et al. |
| 2017/0213960 | A1 | 7/2017 | Paz de Araujo et al. |
| 2017/0213961 | A1 | 7/2017 | Paz de Araujo et al. |
| 2017/0237001 | A1 | 8/2017 | Reid et al. |
| 2017/0243621 | A1 | 8/2017 | Aitken et al. |
| 2017/0243622 | A1 | 8/2017 | Sandhu et al. |
| 2017/0243646 | A1 | 8/2017 | Shifren et al. |
| 2017/0244027 | A1 | 8/2017 | Reid et al. |
| 2017/0244032 | A1 | 8/2017 | Reid et al. |
| 2017/0250340 | A1 | 8/2017 | Paz de Araujo et al. |
| 2017/0352808 | A1 | 12/2017 | Shifren |

FOREIGN PATENT DOCUMENTS

| | | |
|---|---|---|
| WO | 2014108215 A1 | 7/2014 |
| WO | 20140108215 A1 | 4/2017 |

OTHER PUBLICATIONS

U.S. Appl. No. 14/850,213 / Application, filed Sep. 10, 2015, 57 pages.

International Preliminary Report on Patentability, International Application No. PCT/GB2016/0522805, dated Mar. 22, 2018, 11 pages.

International Search Report, International Application No. PCT/GB2016/0522805, dated Dec. 9, 2016, 4 pages.

Written Opinion, International Application No. PCT/GB2016/0522805, dated Dec. 9, 2016, 10 pages.

Official Letter with Search Report, App. No. TW105129236, dated Oct. 24, 2019, 28 Pages.

Response to Official Letter as Filed, App. No. TW105129236, dated Feb. 10, 2020, 24 Pages.

Notice of Allowance, App. No. TW105129236, dated Jan. 31, 2020, 4 Pages.

* cited by examiner

ASYMMETRIC CORRELATED ELECTRON SWITCH OPERATION

CROSS REFERENCE TO RELATED APPLICATIONS

This application is a divisional of U.S. patent application Ser. No. 15/681,236, filed Aug. 18, 2017, titled "ASYMMETRIC CORRELATED ELECTRON SWITCH OPERATION," which is a continuation of U.S. patent application Ser. No. 14/850,213, filed Sep. 10, 2015, titled "ASYMMETRIC CORRELATED ELECTRON SWITCH OPERATION," both of which being assigned to the Assignee of claimed subject matter and incorporated herein by reference in their entirety.

BACKGROUND

Field

Subject matter disclosed herein may relate to a correlated electron switch device.

Information

Integrated circuit devices, such as electronic switching devices, for example, may be found in a wide range of electronic device types. For example, memory and/or logic devices may incorporate electronic switches that may be used in computers, digital cameras, cellular telephones, tablet devices, personal digital assistants, etc. Factors related to electronic switching devices, such as may be incorporated in memory and/or logic devices that may be of interest to a designer in considering suitability for any particular application may include physical size, storage density, operating voltages, and/or power consumption, for example. Other example factors that may be of interest to designers may include cost of manufacture, ease of manufacture, scalability, and/or reliability. Also, there appears to be an ever increasing need for memory and/or logic devices that exhibit characteristics of lower power and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
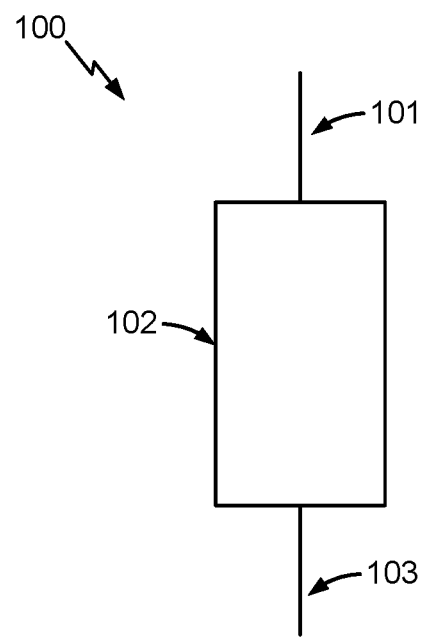
FIG. 1a shows block diagram of an example embodiment of a correlated electron switch (CES) device comprising a correlated electron material, in accordance with an embodiment.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

The terms, "and", "or", "and/or" and/or similar terms, as used herein, include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

Particular aspects of the present disclosure incorporate correlated electron material (CEM) to form a correlated electron switch (CES), such as, for example, in memory and/or logic devices. CES devices may also be utilized in other types of electronic circuits, such as, for example, filter circuits, as discussed more fully below. However, the scope of claimed subject matter is not limited in scope in these respects. In this context, a CES may exhibit a substantially abrupt conductor/insulator transition arising from electron correlations rather than solid state structural phase changes (e.g., crystalline/amorphous in phase change memory (PCM) devices or filamentary formation and conduction in resistive RAM devices). In one aspect, a substantially abrupt conductor/insulator transition in a CES may be responsive to a quantum mechanical phenomenon, in contrast to melting/solidification or filament formation, for example. Such a quantum mechanical transition between conductive and insulative states, and/or between first and second impedance states, in a CES may be understood in any one of several aspects. As used herein, the terms "conductive state", "lower impedance state", and/or "metal state" may be interchangeable, and/or may at times be referred to as a "conductive/lower impedance state." Similarly, the terms "insulative state" and "higher impedance state" may be used interchangeably herein, and/or may at times be referred to as an "insulative/higher impedance state."

In an aspect, a quantum mechanical transition of correlated electron switch material between an insulative/higher impedance state and a conductive/lower impedance state may be understood in terms of a Mott transition. In a Mott transition, a material may switch from an insulative/higher impedance state to a conductive/lower impedance state if a Mott transition condition occurs. The Mott criteria is defined by $(n_C)1/3$ $a \approx 0.26$, where $n_C$ is a concentration of electrons and "a" is the Bohr radius. When a critical carrier concentration is achieved such that the Mott criteria is met, the Mott transition will occur and the state of the CES will change from a higher resistance/higher capacitance state to a lower resistance/lower capacitance state.

In another aspect, the Mott transition is controlled by a localization of electrons. When carriers are localized, the strong coulomb interaction between the electrons splits the bands of the CEM to create an insulator. When electrons are no longer localized, the weak coulomb interaction dominates and the band splitting is removed, resulting in a metal (conductive) band. This is sometimes explained as a "crowded elevator" phenomenon. While an elevator has only a few people in it, the people can move around easily, which is analogous to a conductive/lower impedance state. While the elevator reaches a certain concentration of people, on the other hand, the people can no longer move, which is analogous to the insulative/higher impedance state. However, it should be understood that this classical explanation provided for illustrative purposes, like all classical explanations of quantum phenomenon, is only an incomplete analogy, and that claimed subject matter is not limited in this respect.

In a further aspect, switching from an insulative/higher impedance state to a conductive/lower impedance state may bring about a change in capacitance in addition to a change in resistance. That is, in an aspect, a CES may comprise the property of variable resistance together with the property of variable capacitance. For example, in a metal state, a CEM may have substantially zero electric field, and therefore substantially zero capacitance. Similarly, in an insulative/higher impedance state (in which electron screening may be very imperfect due to lower density of free electrons), an external electric field may be capable of penetrating the CEM and therefore the CEM will have capacitance due to a physical change in the dielectric function of the CEM. Thus, for example, a transition from an insulative/higher impedance state to a conductive/lower impedance state in a CES may result in changes in both resistance and capacitance, in an aspect.

In an embodiment, a CES device may switch impedance states responsive to a Mott-transition in a majority of the volume of the CEM of a CES device. In an embodiment, a CES device may comprise a "bulk switch." As used herein, the term "bulk switch" refers to at least a majority volume of a CEM of a CES device switching impedance states, such as responsive to a Mott-transition. For example, in an embodiment, substantially all of a CEM of a CES device may switch from an insulative/higher impedance state to a conductive/lower impedance state or from a conductive/lower impedance state to an insulative/higher impedance state responsive to a Mott-transition. In an aspect, a CEM may comprise one or more transition metal oxides, one or more rare earth oxides, one or more oxides of one or more f-block elements of the periodic table, one or more rare earth transitional metal oxide perovskites, yttrium, and/or ytterbium, although claimed subject matter is not limited in scope in this respect. In an embodiment, a device, such as CES device, may comprise CEM including one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof, although claimed subject matter is not limited in scope in this respect.

FIG. 1a shows an example embodiment 100 of a CES device comprising CEM, such as material 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, the CEM, such as material 102, may transition between the aforementioned conductive/lower impedance state and insulative/higher impedance state. As mentioned, CEM, such as material 102, in a variable impeder device, such as variable impeder 100, may transition between a first impedance state and a second impedance state due to a quantum mechanical transition of the correlated electron switch material as a result an applied critical voltage and an applied critical current, as described in more detail below. Also, as mentioned above, a variable impeder device, such as variable impeder device 100, may exhibit properties of both variable resistance and variable capacitance.

In a particular embodiment, a variable impeder device, such as variable impeder device 100, may comprise CEM that may transition between or among a plurality of detectable impedance states based, at least in part, on a transition of at least a majority portion of the CEM between an insulative/higher impedance state and a conductive/lower impedance state due to a quantum mechanical transition of the correlated electron switch material. For example, in an embodiment, a variable impeder device may comprise a bulk switch, in that substantially all of a CEM of a variable impeder device may switch from an insulative/higher impedance state to a conductive/lower impedance state or from a conductive/lower impedance state to an insulative/higher impedance state responsive to a Mott-transition. In this context, an "impedance state" means a detectable state of a variable impeder device that is indicative of a value, symbol, parameter and/or condition, just to provide a few examples. In one particular embodiment, as described below, an impedance state of a variable impeder device may be detected based, at least in part, on a signal detected on terminals of the variable impeder device in a read and/or sense operation. In another particular embodiment, as described below, a variable impeder device may be placed in a particular impedance state to represent or store a particular value, symbol, and/or parameter, and/or to achieve a particular capacitance value for the variable impeder device by application of one or more signals across terminals of the variable impeder device in a "write" and/or "program" operation, for example. Of course, claimed subject matter is not limited in scope to the particular example embodiments described herein.

Figure 1B:
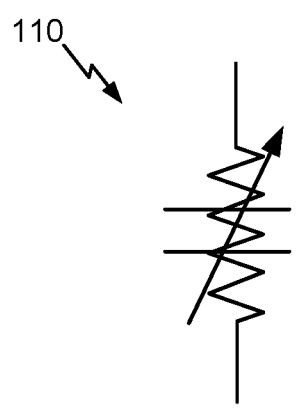
FIG. 1b depicts an example symbol for a correlated electron switch.

FIG. 1b depicts an example symbol 110 that may be utilized, for example, in electrical circuit schematic diagrams to notate a CES and/or a variable impeder device. Example symbol 110 is meant to remind the viewer of the variable resistance and variable capacitance properties of a CES and/or variable impeder device, such as variable impeder device 100. Example symbol 110 is not meant to represent an actual circuit diagram, but is merely meant as an electrical circuit diagram symbol. Of course, claimed subject matter is not limited in scope in these respects.

Figure 2:
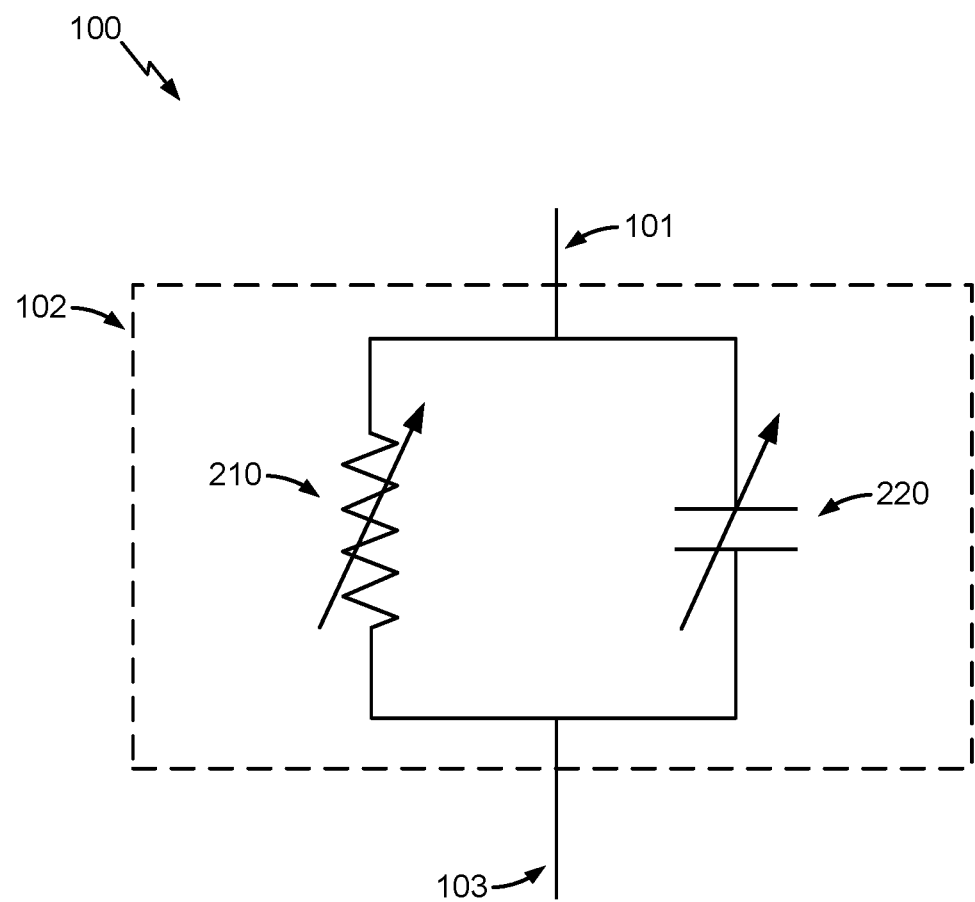
FIG. 2 is a schematic diagram of an equivalent circuit of a CES, in accordance with an embodiment.

FIG. 2 depicts a schematic diagram of an equivalent circuit of an example variable impeder device, such as variable impeder device 100. As mentioned, a variable impeder device may comprise characteristics of both variable impedance and variable capacitance. For example, an equivalent circuit for a variable impeder device may, in an embodiment, comprise a variable resistor, such as variable resistor 210 in parallel with a variable capacitor, such as variable capacitor 220. Of course, although a variable resistor 210 and variable capacitor 220 are depicted in FIG. 2 as comprising discrete components, a variable impeder device, such as variable impeder device 100, may comprise a substantially homogenous CEM, such as CEM 102, wherein the CEM comprises characteristics of variable capacitance and variable resistance.

Table 1 below depicts an example truth table for an example variable impeder device, such as variable impeder device 100.

TABLE 1

Correlated Electron Switch Truth Table

| Resistance | Capacitance |
|---|---|
| $R_{high}(V_{applied})$ | $C_{high}(V_{applied})$ |
| $R_{low}(V_{applied})$ | $C_{low}(V_{applied})$~0 |

In an embodiment, example truth table 120 shows that a resistance of a variable impeder device, such as variable impeder device 100, may transition between a lower resistance state and a higher resistance state that is a function, at least in part, of a voltage applied across the CEM. In an embodiment, a resistance of a lower resistance state may be 10-100,000 times lower than a resistance of a higher impedance state, although claimed subject matter is not limited in scope in this respect. Similarly, example truth table 120 shows that a capacitance of a variable impeder device, such as variable impeder device 100, may transition between a lower capacitance state, which for an example embodiment may comprise approximately zero, or very little, capacitance, and a higher capacitance state that is a function, at least in part, of a voltage applied across the CEM. It should be noted that a variable impeder is not a resistor, but rather comprises a device having properties of both variable capacitance and variable resistance. In an embodiment, resistance and/or capacitance values depend, at least in part, on an applied voltage.

Figure 3:
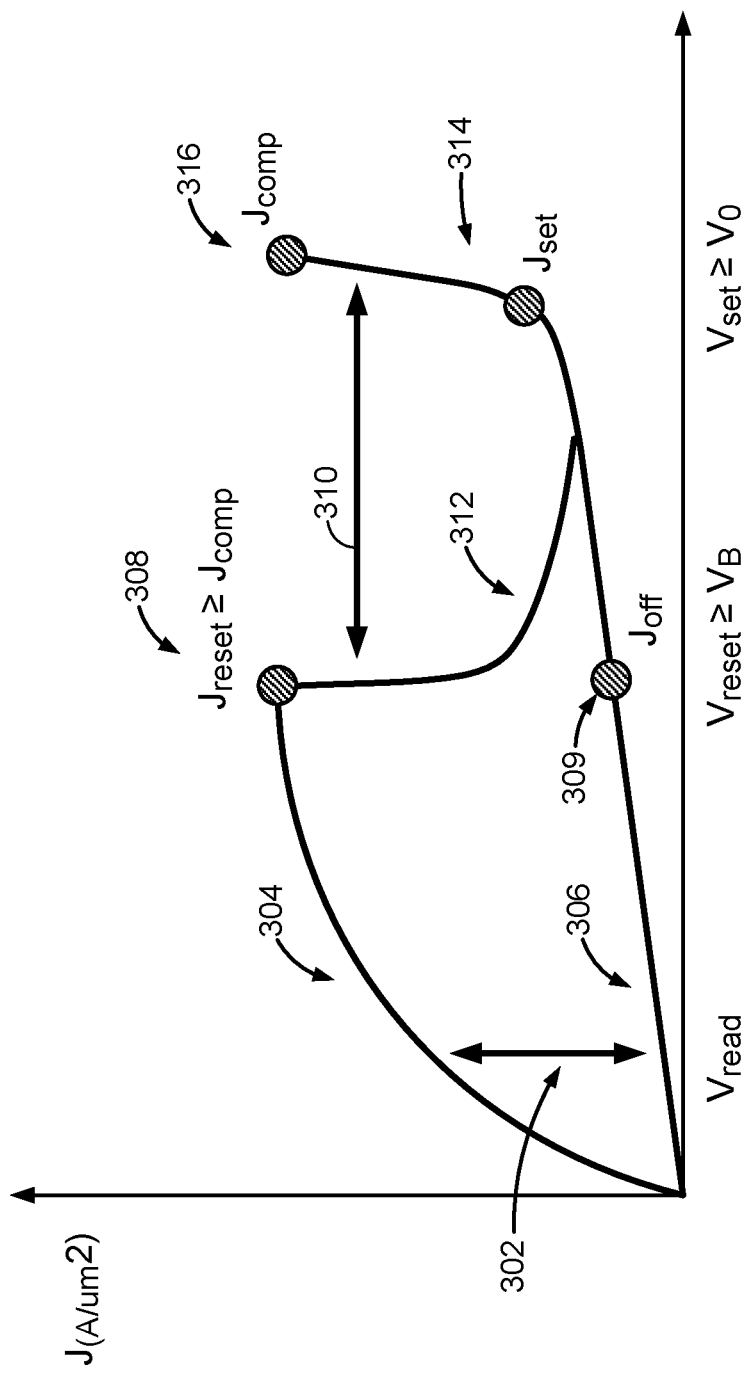
FIG. 3 shows a plot of current density versus voltage for a CES, according to an embodiment.

FIG. 3 shows a plot of current density versus voltage across electrically conductive terminals, such as electrically conductive terminals 101 and 103, for a variable impeder device, such as example variable impeder device 100, according to an embodiment. Based, at least in part, on a voltage applied to terminals of a variable impeder device (e.g., in a write operation), such as variable impeder device 100, a CEM, such as CEM 102, may be placed in a conductive/lower impedance state or an insulative/higher impedance state. For example, application of a voltage $V_{reset}$ and current density $J_{reset}$ may place the variable impeder device in an insulative/higher impedance state, and application of a voltage $V_{set}$ and a current density $J_{set}$ may place the variable impeder device in a conductive/lower impedance state. That is, a "set" operation may place a variable impeder device, such as variable impeder device 100, into a conductive/lower impedance state, and a "reset" operation may place a variable impeder device, such as variable impeder device 100, into an insulative/higher impedance state, in an embodiment. Following placement of the variable impeder device in a lower impedance state or a higher impedance state, the particular state of the variable impeder device may be detected at least in part by application of a voltage $V_{read}$ (e.g., in a read operation) and detection of a current or current density at terminals, such as electrically conductive terminals 101 and 103, of a variable impeder device, such as variable impeder device 100.

In an embodiment, a CEM of a variable impeder device may include, for example, any TMO, such as, for example, peroskovites, Mott insulators, charge exchange insulators, and/or Anderson disorder insulators. In a particular embodiment, a CES device may be formed from materials such as nickel oxide, cobalt oxide, iron oxide, yttrium oxide and peroskovites such as Cr doped strontium titanate, lanthanum titanate, and the manganite family including praesydium calcium manganite, and praesydium lanthanum manganite, to provide a few examples. In an embodiment, oxides incorporating elements with incomplete d and f orbital shells may exhibit sufficient impedance switching properties for use in a CES device. In an embodiment, a CES may be prepared without electroforming. Other embodiments may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from the scope of claimed subject matter.

In one aspect, the variable impeder device of FIG. 1 may comprise materials that comprise TMO metal oxide variable impedance materials, though it should be understood that these are exemplary only, and are not intended to limit the scope of claimed subject matter. Particular implementations may employ other variable impedance materials as well. Nickel oxide, NiO, is disclosed as one particular TMO. NiO materials discussed herein may be doped with extrinsic ligands, which may stabilize variable impedance properties by passivating the interfacing and allowing for adjustable voltages and impedances, in an embodiment. In a particular embodiment, NiO variable impedance materials disclosed herein may include a carbon containing ligand, which may be indicated by NiO($C_x$). Here, one skilled in the art may determine a value of x for any specific carbon containing ligand and any specific combination of carbon containing ligand with NiO simply by balancing valences, in an embodiment. In another particular example embodiment, NiO doped with extrinsic ligands may be expressed as NiO($L_x$), where $L_x$ is a ligand element or compound and x indicates a number of units of the ligand for one unit of NiO. One skilled in the art may determine a value of x for any specific ligand and any specific combination of ligand with NiO or any other transition metal simply by balancing valences, in an embodiment.

According to an embodiment, if sufficient bias is applied (e.g., exceeding a band-splitting potential) and the aforementioned Mott condition is met (injected electron holes=the electrons in the switching region), the variable impeder device may rapidly switch from a conductive/lower impedance state to an insulator state via the Mott transition. This may occur at point 308 of the plot in FIG. 3. At this point, electrons are no longer screened and become localized. This correlation splits the bands to form an insulator. While the CEM of the variable impeder device is still in the insulative/higher impedance state, current may generated by transportation of holes. If enough bias is applied across terminals of the variable impeder device, electrons may be injected into a metal-insulator-metal (MIM) diode over the potential barrier of the MIM device. If enough electrons have been injected and enough potential is applied across terminals to achieve a set condition, an increase in electrons may screen electrons and remove a localization of electrons, which may collapse the band-splitting potential forming a metal, thereby placing the variable impeder device in a conductive/lower impedance state.

According to an embodiment, current in a CEM of a variable impeder device may be controlled by an externally applied "compliance" condition determined based, at least in part, on the external current limited during a write operation to achieve a set condition to place the variable impeder device in a conductive/lower impedance state. This externally applied compliance current also sets the subsequent reset condition current density requirement. As shown in the particular implementation of FIG. 3, a current density $J_{comp}$ applied during a write operation at point 316 to place the variable impeder device in a conductive/lower impedance state may determine a compliance condition for placing the variable impeder device in an insulative/higher impedance state in a subsequent write operation. As shown, the CEM of the variable impeder device may be subsequently placed in an insulative/higher impedance state by application of a current density $J_{reset} \geq J_{comp}$ at a voltage $V_{reset}$ at point 308, wherein $J_{comp}$ may be externally applied, in an embodiment.

A compliance current, such as an externally applied compliance current, therefore may set a number of electrons in a CEM of a variable impeder device which are to be "captured" by holes for the Mott transition. In other words, a current applied in a write operation to place a variable impeder device in a conductive/lower impedance state may determine a number of holes to be injected to the CEM of the variable impeder device for subsequently transitioning the variable impeder device to an insulative/higher impedance state. As discussed more fully below, a compliance current may be applied dynamically.

As pointed out above, a transition to an insulative/higher impedance state may occur in response to a Mott transition at point 308. As pointed out above, such a Mott transition may occur at a condition in a CEM of a variable impeder device in which a concentration of electrons n equals a concentration of electron holes p. This condition occurs when the following Mott criteria is met, as represented by expression (1) as follows:

$$\lambda_{TF} n^{\frac{1}{3}} = C \sim 0.26 \qquad (1)$$
$$n = \left(\frac{C}{\lambda_{TF}}\right)^3$$

where:
$\lambda_{TF}$ is a Thomas Fermi screening length; and
C is a constant which equals approximately 0.26 for the Mott transition.

According to an embodiment, a current or current density in a region 304 of the plot shown in FIG. 3 may exist in response to an injection of holes from a voltage signal applied across terminals, such as terminals 101 and 103, of a variable impeder device, such as variable impeder device 100. Here, injection of holes may meet a Mott transition criterion for the conductive to insulator transition at current IAN as a critical voltage VAN is applied across terminals, such as terminal 101 and 103, of a variable impeder device, such as variable impeder device 100. This may be modeled according to expression (2) as follows:

$$I_{MI}(V_{MI}) = \frac{dQ(V_{MI})}{dt} \approx \frac{Q(V_{MI})}{t} \qquad (2)$$
$$Q(V_{MI}) = qn(V_{MI})$$

Where $Q(V_{MI})$ is the charge injected (hole or electron) and is a function of the applied voltage. As used herein, the notation "MI" signifies a metal-to-insulator transition, and the notation "IM" signifies an insulator-metal transition. That is, "$V_{MI}$" refers to a critical voltage and "$I_{MI}$" refers to a critical current to transition a CEM from a conductive/lower impedance state to an insulative/higher impedance state. Similarly, "$V_{IM}$" refers to a critical voltage and "$I_{IM}$" refers to a critical current to transition a CEM from an insulative/higher impedance state to a conductive/lower impedance state.

Injection of holes to enable a Mott transition may occur between bands and in response to critical voltage $V_{MI}$ and critical current IAN. By equating electron concentration n with the needed charge concentration to result in a Mott transition by holes injected by IAN in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$
$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}(V_{MI})}\right)^3$$

Wherein $A_{CEM}$ is a cross-sectional area of a CEM, such as CEM 102, of a variable impeder device, such as variable impeder device 100, and wherein $J_{reset}(V_{MI})$, depicted at point 308 of example plot 300, is a current density through the CEM, such as CEM 102, to be applied to the CEM at a critical voltage $V_{MI}$ to place the CEM of the variable impeder device in an insulative/higher impedance state. In an embodiment, a CEM may be switched between a conductive/lower impedance state and an insulative/higher impedance state at least in part by a disproportionation reaction.

According to an embodiment, a CEM, such as CEM 102, of a variable impeder device, such as variable impeder device 100, may be placed in a conductive/lower impedance state (e.g., by transitioning from an insulative/higher impedance state) by injection of a sufficient number of electrons to satisfy a Mott transition criteria.

In transitioning a CEM of a variable impeder device to a conductive/lower impedance state, as enough electrons have been injected and the potential across terminals of the variable impeder device overcomes a critical switching potential (e.g., $V_{set}$), injected electrons begin to screen and unlocalize double-occupied electrons to reverse a disproportion reaction and closing the bandgap. A current density $J_{set}(V_{MI})$, depicted at point 314 of FIG. 3, for transitioning the CEM of the variable impeder device to the conductive/lower impedance state in a metal-insulator Mott transition at a critical voltage $V_{MI}$ enabling transition to the conductive/lower impedance state may be represented according to expressions (4) as follows:

$$I_{MI}(V_{MI}) = \frac{dQ(V_{MI})}{dt} \approx \frac{Q(V_{MI})}{t} \quad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{IM}) = J_{injection}(V_{IM}) = J_{IM}(V_{IM}) = \frac{I_{IM}(V_{IM})}{A_{CEM}} = \frac{q}{A_{CEM}t}\left(\frac{C}{a_B}\right)^3$$

where:
$a_B$ is a Bohr radius.

According to an embodiment, a "read window" 302 for detecting a memory state of a variable impeder device in a read operation may be set out as a difference between a portion 306 the plot of FIG. 3 while the CEM of the variable impeder device is in an insulative/higher impedance state and a portion 304 of the plot FIG. 3 while the CEM of the variable impeder device is in a conductive/lower impedance state at a read voltage $V_{read}$. In a particular implementation, read window 302 may be used to determine the Thomas Fermi screening length $\lambda_{TF}$ of a CEM, such as correlated electron switch material 102, of a variable impeder device, such as variable impeder device 100. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \quad (5)$$

wherein $J_{off}$ represents a current density of a CEM in an insulative/higher impedance state at $V_{reset}$. See, for example, point 309 of FIG. 3.

In another embodiment, a "write window" 310 for placing a CEM of variable impeder device in an insulative/higher impedance or conductive/lower impedance state in a write operation may be set out as a difference between $V_{reset}$ and $V_{set}$. Establishing $|V_{set}|>|V_{reset}|$ may enable a switch between the conductive/lower impedance and insulative/higher impedance state. $V_{reset}$ may comprise approximately the band splitting potential caused by the correlation and $V_{set}$ may comprise approximately twice the band splitting potential, such that the read window may comprise approximately the band-splitting potential. In particular implementations, a size of write window 310 may be determined, at least in part, by materials and doping of the CEM of the variable impeder device.

In an embodiment, a process for reading a value represented as an impedance state of a variable impeder device, such as variable impeder device 100, may comprise a voltage being applied to a CEM of a variable impeder device. At least one of a current and/or current density within a CEM of a variable impeder device may be measured, and an impedance state of a CEM of a variable impeder device may be determined, at least in part, on the measured current and/or current density, in an embodiment.

Additionally, in an embodiment, an impedance of an impedance state may depend at least in part on a combination of a capacitance and a resistance of a CEM of a variable impeder device. In an embodiment, the determined impedance state may comprise one of a plurality of impedance states. A first impedance state may comprise a lower resistance and lower capacitance, and a second impedance state may comprise a higher resistance and a higher capacitance, for example. Also, in an embodiment, a ratio of the impedances of the plurality of impedance states may be proportional to a physical property of the CEM of the variable impeder device. In an embodiment, the physical property of the CEM of the variable impeder device may comprise at least one of a Thomas Fermi screening length and a Bohr radius. Further, in an embodiment, individual impedance states of the plurality of impedance states may be associated with a data value. Additionally, in an embodiment, a difference in current between a first impedance state and a second impedance state at a predetermined voltage provides an indication of a read window. However, claimed subject matter is not limited in scope in these respects.

In an embodiment, a plurality of electrons may be provided to a CEM of a variable impeder device such that the CEM enters a first impedance state. A plurality of holes may be provided to the CEM such that the CEM enters a second impedance state. Also, in an embodiment, the plurality of electrons may cause a voltage across the CEM to be greater than a set voltage threshold, and the plurality of holes may cause the voltage across the CEM to be equal to or greater than a reset voltage threshold. Further, in an embodiment, a voltage across the CEM may cause a current density in the CEM to be equal to or greater than a set current density and/or a set current, and a voltage across the CEM may cause a current density in the CEM to be equal to or greater than a reset current density and/or a reset current.

Also, in an embodiment, a set voltage across the CEM and a set current density through a CEM of a variable impeder device may be exceeded. Additionally, a reset voltage across a CEM and a reset current density through a CEM of a variable impeder device may be exceeded. Further, in an embodiment, individual impedance states of a plurality of impedance states may be associated with a data value.

In an embodiment, at least one of a reset voltage, a set voltage, and a difference between the set voltage and the reset voltage are proportional to a physical property of a CEM of a variable impeder device. A physical property of a CEM may include at least one of a strong electron potential due to localization, and/or a correlation of electrons, for example. Also, in an embodiment, a difference in the set voltage and the reset voltage may provide an indication of a size of at least one of a write/program window.

According to an embodiment, a write operation as discussed above may be characterized by a particular voltage condition and a particular current condition sufficient to place a CES in a particular impedance state. For example, a set operation to place a CES in a low impedance or conductive state may be characterized by a "set voltage condition" (e.g., $V_{set}$) and a "set current condition" ($I_{set}$). For example, point 314 in the plot of FIG. 3 indicates a particular set voltage condition along a voltage axis and a particular set current condition along a current or current density axis. Similarly, a reset operation to place a CES in a high impedance or insulative state may be characterized by a "reset voltage condition" (e.g., $V_{reset}$) and a "reset current condition" ($I_{reset}$). Additionally, as pointed out above, a particular reset current condition for a CES may be determined based, at least in part, on a compliance current ($I_{comp}$) applied at point 316 in a previous set operation.

Figure 4:
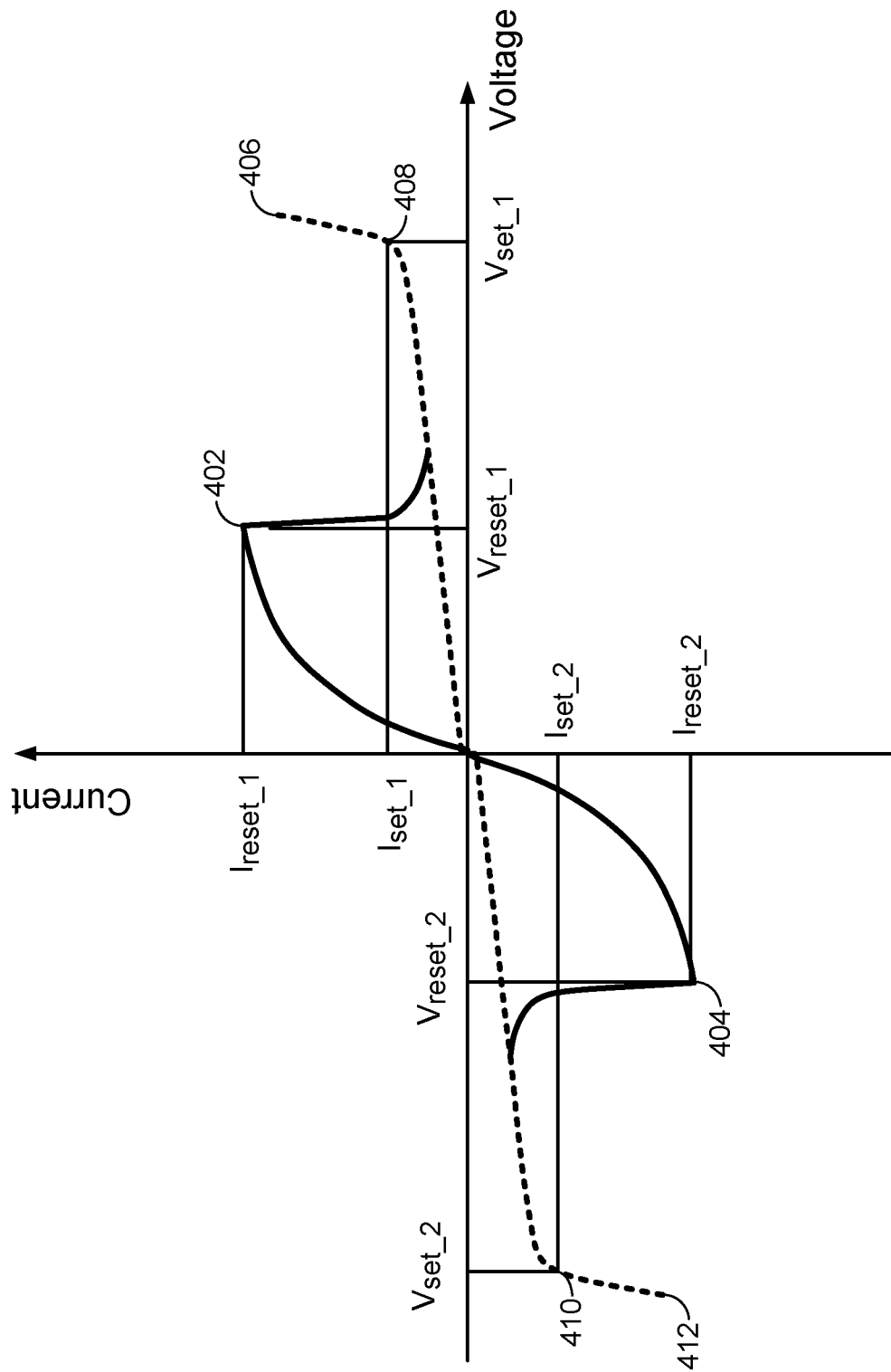
FIG. 4 is a plot illustrating symmetric operation of a CES device according to an embodiment.

As may be observed from the plot of FIG. 3, a programming signal to place a CES in a low impedance or conductive state may satisfy a set voltage condition having a positive polarity and a set current condition having a positive polarity. Likewise a programming signal to place a CES in a high impedance or insulative state may satisfy a reset voltage condition having a positive polarity and a reset current condition having a positive polarity. In particular embodiments, as illustrated in FIG. 4, write operation may be performed by meeting alternative voltage and current conditions in different polarities. In this context, operation in the voltage versus current plot of FIG. 4 with current and voltage both having a positive polarity places operation in the first quadrant while operation with current and voltage having a negative polarity places operation in the third quadrant. For example, point 408 may define a first set voltage condition of $V_{set\_1}$ and a first set current condition $I_{set\_1}$ in a first quadrant while point 410 may define a second set voltage condition of $V_{set\_2}$ and a second reset current condition $I_{set\_2}$ in a third quadrant. In other words a particular CES device having operational characterized by the plot of FIG. 4 may be placed in a low impedance or conductive state by application of a programming signal having a voltage $V_{set\_1}$ and a current $I_{set\_1}$ (at point 408), or by application of a programming signal having a voltage $V_{set\_2}$ and a current $I_{set\_2}$ (at point 410).

Likewise, point 402 may define a first reset voltage condition of $V_{reset\_1}$ and a first reset current condition $I_{reset\_1}$ in a first quadrant while point 404 may define a second reset voltage condition of $V_{reset\_2}$ and a second reset current condition $I_{reset\_2}$ in a third quadrant. In other words a particular CES device having operational characterized by the plot of FIG. 4 may be placed in a high impedance or insulative state by application of a programming signal having a voltage $V_{reset\_1}$ and a current $I_{reset\_1}$ (at point 402), or by application of a programming signal having a voltage $V_{reset\_2}$ and a current $I_{reset\_2}$ (at point 404). Here, first and second reset current conditions $I_{reset\_1}$ and $I_{reset\_2}$ may be determined based on a magnitude of a compliance current applied in a previous set operation at either point 406 or 412.

In the particular embodiment of FIG. 4, a CES device may be characterized as having symmetric voltage and current conditions for write operations to place the CES in a particular impedance state. Here, as discussed above, first set voltage and current conditions ($V_{set\_1}$ and $I_{set\_1}$) are symmetric with second set voltage and current conditions ($V_{set\_2}$ and $I_{set\_2}$) in that $|V_{set\_1}|\approx|V_{set\_2}|$ and $|I_{set\_1}|\approx|I_{set\_2}|$. Likewise, first reset voltage and current conditions ($V_{reset\_1}$ and $I_{reset\_1}$) are symmetric with second set voltage and current conditions ($V_{reset\_2}$ and $I_{reset\_2}$) in that $|V_{reset\_1}|\approx|V_{reset\_2}|$ and $|I_{reset\_1}|\approx|I_{reset\_2}|$. In this context, symmetric voltage conditions for a particular write operation are polar opposite voltages of substantially the same magnitude. Similarly, symmetric current conditions for a particular write operation are polar opposite currents of substantially the same magnitude.

Figure 5A:
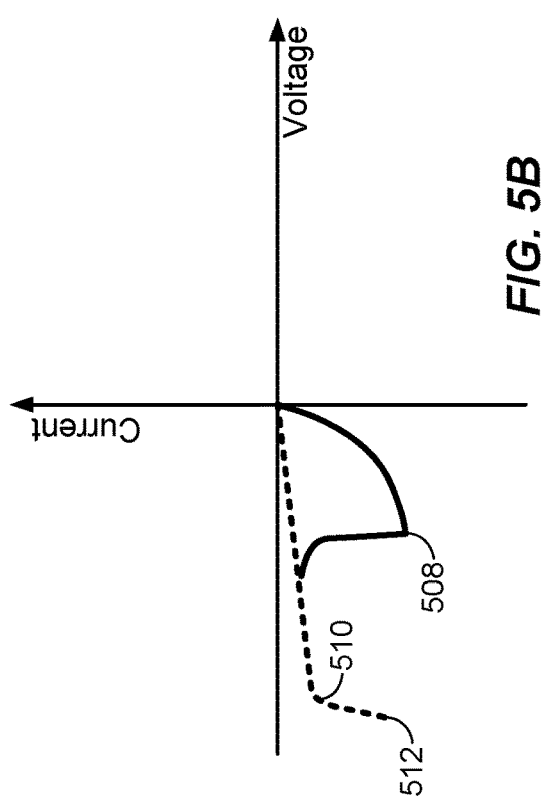
FIGS. 5A through 5D are plots illustrating symmetric operation of a CES device according particular embodiments.
Figure 5B:
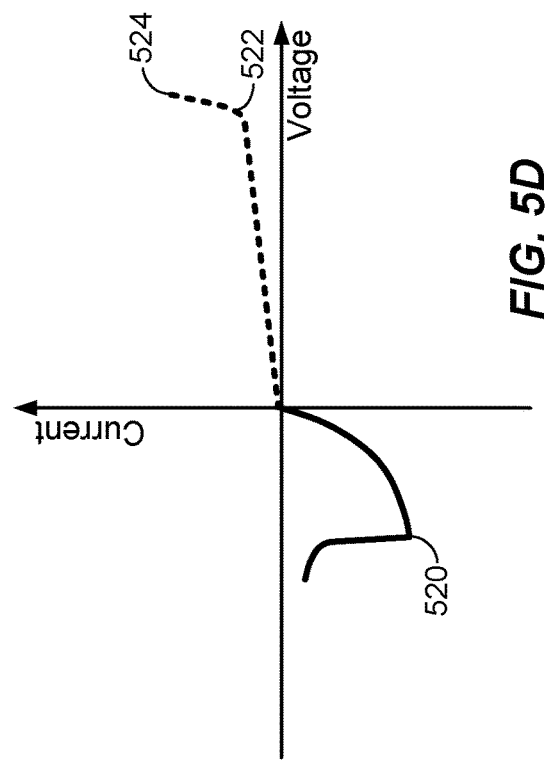
Figure 5C:
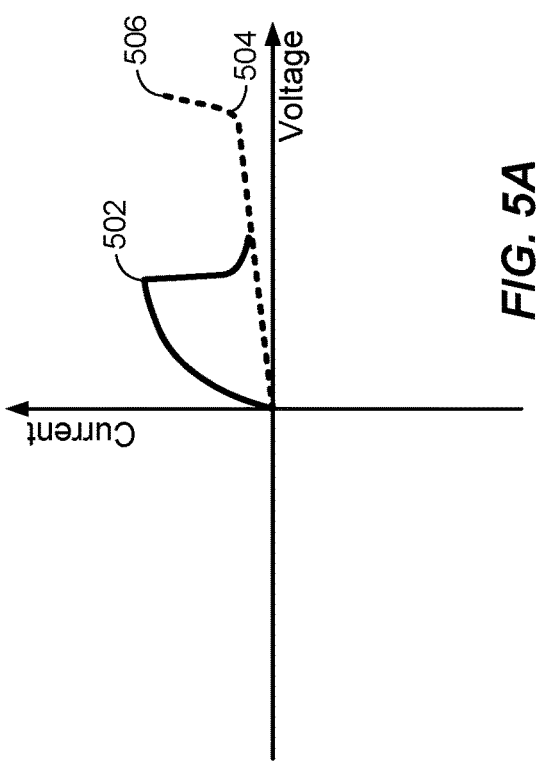
Figure 5D:
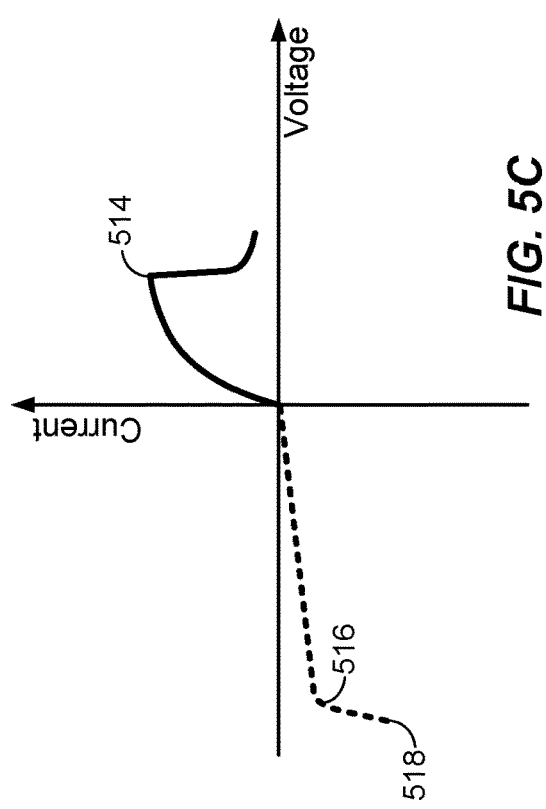

In particular embodiments, FIGS. 5A through 5D are plots illustrating symmetric operation of a CES device according particular embodiments such as the CES device discussed above with reference to FIG. 4. Here, it may observed that a set operation and a reset operation may occur in the same or different quadrants of a voltage vs. current mapping. In FIG. 5A, for example, set voltage and current conditions at point 504 ($V_{set\_1}$ and $I_{set\_1}$) are in the first quadrant as reset voltage and current conditions at point 502 ($V_{reset\_1}$ and $I_{reset\_1}$). Similarly in FIG. 5B, set voltage and current conditions at point 510 ($V_{set\_2}$ and $I_{set\_2}$) are in the third quadrant as reset voltage and current conditions at point 508 ($V_{reset\_2}$ and $I_{reset\_2}$) are also in the third quadrant. In contrast, in FIG. 5C, set voltage and current conditions at point 516 ($V_{set\_2}$ and $I_{set\_2}$) are in the third quadrant while reset voltage and current conditions at point 514 ($V_{reset\_1}$ and $I_{reset\_1}$) are in the first quadrant. Also, in FIG. 5D, set voltage and current conditions at point 522 ($V_{set\_1}$ and $I_{set\_1}$) are in the first quadrant while reset voltage and current conditions at point 520 ($V_{reset\_2}$ and $I_{reset\_2}$) are in the third quadrant. As may be observed, set voltage and current conditions in the first quadrant in FIGS. 5A and 5D at points 504 and 522 are symmetric with set voltage and current conditions in the third quadrant in FIGS. 5B and 5C. Similarly, reset voltage and current conditions in the first quadrant in FIGS. 5A and 5C at points 502 and 524 are symmetric with reset voltage and current conditions in the third quadrant in FIGS. 5B and 5D at points 508 and 520. It should be understood that a set or reset operations may occur either the first or third quadrants regardless of whether a most recent write operation occurred in the first quadrant of the third quadrant.

Figure 6:
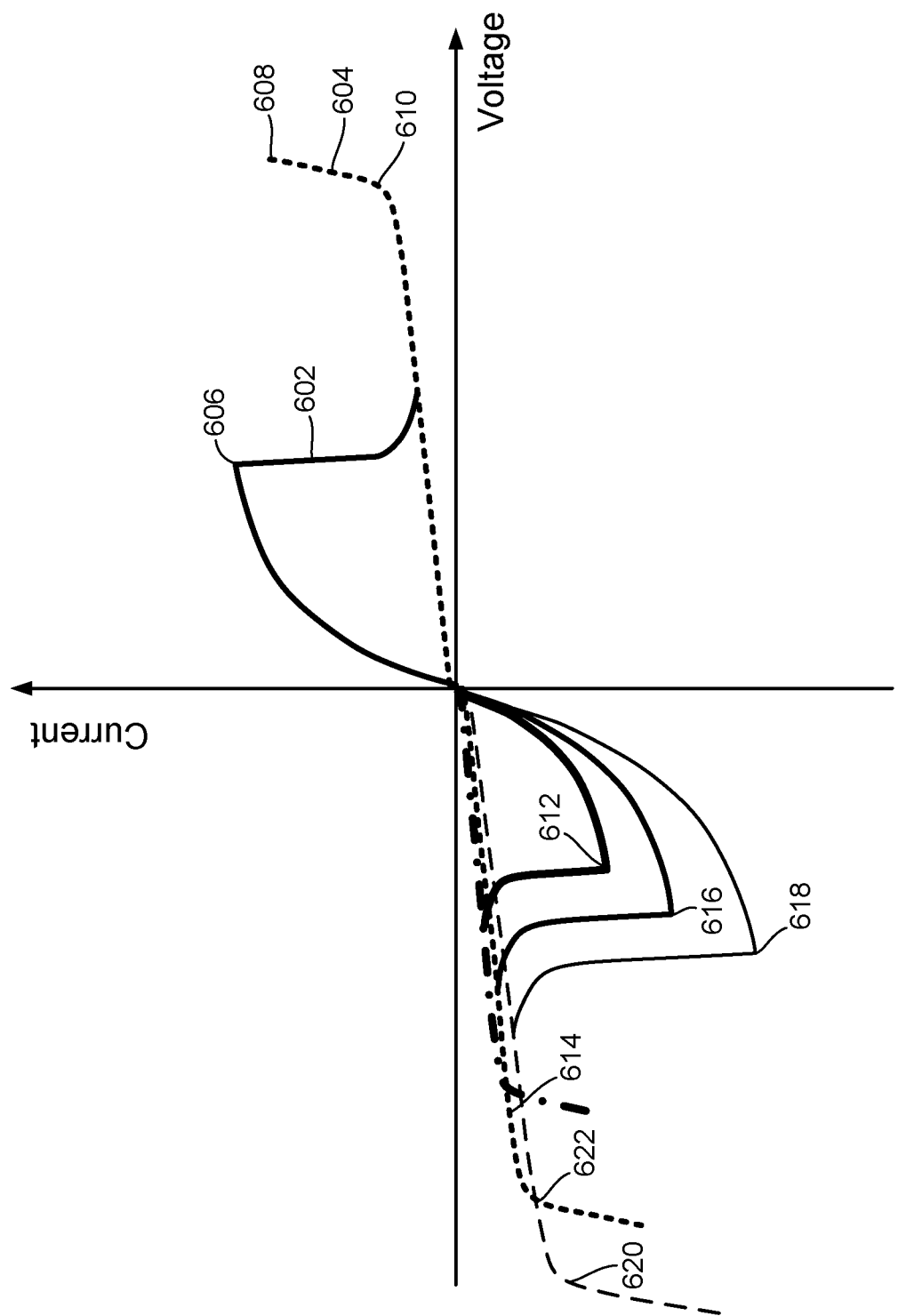
FIG. 6 is a plot illustrating asymmetric operation of a CES device in accordance with an embodiment.

FIG. 6 shows plots illustrating asymmetric operation of a CES device in accordance with an embodiment. In a first quadrant of a voltage vs current plot for write operations according to an embodiment, first set voltage and current conditions are shown at point 610 ($V_{set\_1}$ and $I_{set\_1}$) and first reset voltage and current conditions are shown at point 606 ($V_{reset\_1}$ and $I_{reset\_1}$). The third quadrant of the plot of FIG. 6 shows three alternative plots with corresponding alternative second set voltage and current conditions, and corresponding second reset voltage and current conditions. A first alternative plot defines second set voltage and current conditions at point 622 ($V_{set\_2}$ and $I_{set\_2}$), and second reset voltage and current conditions at point 616 ($V_{reset\_2}$ and $I_{reset\_2}$). For this particular alternative plot, it may be observed that the first set voltage and current conditions of point 622 are symmetric with the second set voltage and current conditions of point 610 in the first quadrant (e.g., $|V_{set\_1}|\approx|V_{set\_2}|$ and $|I_{set\_1}|\approx|I_{set\_2}|$). Likewise, it may be observed that the first reset voltage and current conditions of point 616 are symmetric with the second set voltage and current conditions of point 606 in the first quadrant (e.g., $|V_{reset\_1}|\approx|V_{reset\_2}|$ and $|I_{reset\_1}|\approx|I_{reset\_2}|$).

A second alternative plot in the third quadrant defines second set voltage and current conditions at point 614, and second reset voltage and current conditions at point 612. Here, it may be observed that the second set voltage and current conditions at point 614 in the third quadrant are asymmetric with the first set voltage and current conditions at point 610 in the first quadrant in that $|V_{set\_1}|>>|V_{set\_2}|$ and $|I_{set\_1}|>>|I_{set\_2}|$. Likewise, it may be observed that the second reset voltage and current conditions at point 612 in the third quadrant are asymmetric with the first reset voltage and current conditions at point 606 in the first quadrant in that $|V_{reset\_1}|>>|V_{reset\_2}|$ and $|I_{reset\_1}|>>|I_{reset\_2}|$.

A third alternative plot in the third quadrant defines second set voltage and current conditions at point 620, and second reset voltage and current conditions at point 618. Here, it may be observed that the second set voltage and current conditions at point 620 in the third quadrant are asymmetric with the first set voltage and current conditions at point 610 in the first quadrant in that $|V_{set\_1}|<<|V_{set\_2}|$ and $|I_{set\_1}|<<|I_{set\_2}|$. Likewise, it may be observed that the second reset voltage and current conditions at point 618 in the third quadrant are asymmetric with the first reset voltage and current conditions at point 606 in the first quadrant in that $|V_{reset\_1}|<<|V_{reset\_2}|$ and $|I_{reset\_1}|<<|I_{reset\_2}|$.

According to an embodiment, and with reference to nomenclature for set and reset voltage and current conditions established in FIG. 4, first and second set voltage conditions for a CES device are "asymmetric" if a difference between $|V_{set\_1}|$ and $|V_{set\_2}|$ is large enough to significantly or measurably affect operation or behavior of a circuit implementing the CES device. Similarly, first and second set current conditions are similarly asymmetric if a difference between $|I_{set\_1}|$ and $|I_{set\_2}|$ is large enough to significantly or measurably affect operation or behavior of a circuit implementing the CES device. First and second reset voltage conditions, and first and second reset current conditions of a CES device are similarly asymmetric if a difference between $|V_{reset\_1}|$ and $|V_{reset\_2}|$, or a difference between $|I_{reset\_1}|$ and $|I_{reset\_2}|$ is large enough to significantly or measurably affect operation or behavior of a circuit incorporating the CES device.

Figure 7A:
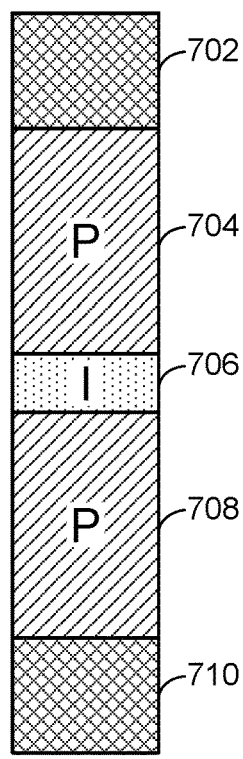
FIGS. 7A through 7I are diagrams illustrating structures of CES devices according to particular embodiments.

In a particular implementation, a CES may be formed by coupling a CEM substrate between conductive terminals. According to an embodiment, a process for manufacturing a CES device may affect a composition of structure of a CEM substrate so as to provide a CES having asymmetric voltage or current conditions for a set or reset operation as described above. FIGS. 7A through 7I are diagrams illustrating structures of CES devices according to particular embodiments. FIG. 7A shows a structure of a CES comprising CEM substrate (e.g., a transition metal oxide) formed between terminals 702 and 710. A center portion 706 of the CEM is maintained in an intrinsic state while equal portions 704 and 708 are doped as P-type regions. Here, the symmetry of the structure of the CEM between terminals 702 and 710 may provide symmetric set voltage and current conditions, and symmetric reset voltage and current conditions as discussed above (e.g., as illustrated in the plot of FIG. 4). As described below in particular implementations, altering the composition or structure of CEM between terminals may introduce asymmetric behavior in set and reset operations.

Asymmetries described above may be introduced in a CES device (e.g., in a manufacturing process) using any one of several techniques to affect a structure or composition of a CEM substrate of CES. For example, as a bias and injected charge is applied to terminals of a CES device to place the CES device in a particular impedance state, physical properties or structure of the CES device may affect a rate of carrier injection. In a set operation to place a CES device in a low impedance or conductive state, for example, the CES device may be controlled via electron injection over a metal/insulator barrier.

Figure 7B:
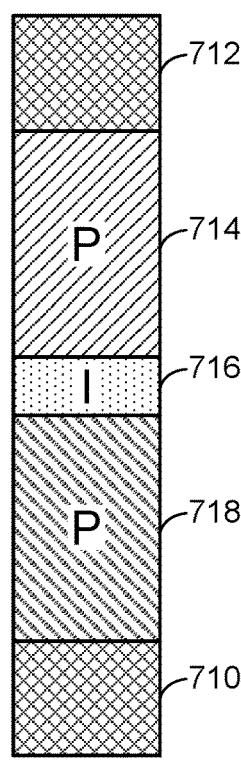
Figure 7C:
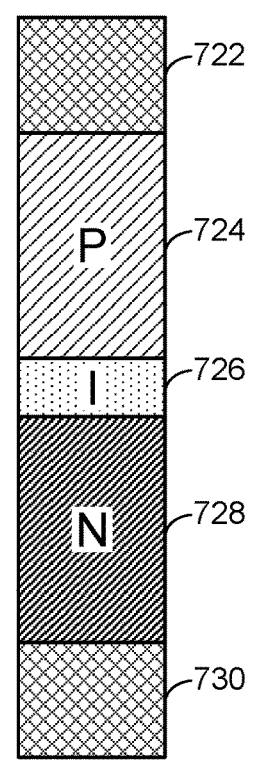

In one implementation, the structure or composition of CES device of FIG. 7A may be altered as shown in FIG. 7B to introduce an asymmetry in set or reset voltage or current conditions. As shown in FIG. 7B, region 714 is more heavily P-type doped than region 718. In another implementation as shown in FIG. 7C, a region 724 is P-typed doped, region 728 is N-type doped and region 726 is maintained in an intrinsic state to provide a PIN structure. In such a PIN structure, injection of electrons may be amplified by injection via N-type doped region 728. This may tune switching behavior in a CES device by introducing different set voltage and current conditions and/or different reset voltage and current conditions in a reverse polarity (e.g., third quadrant).

Figure 7D:
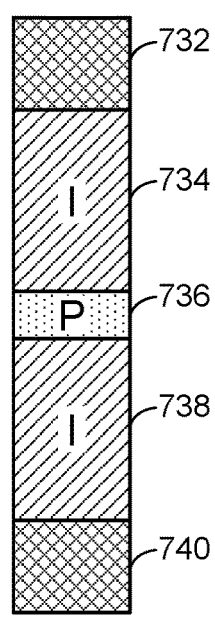
Figure 7E:
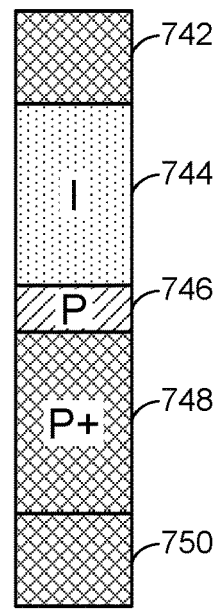
Figure 7F:
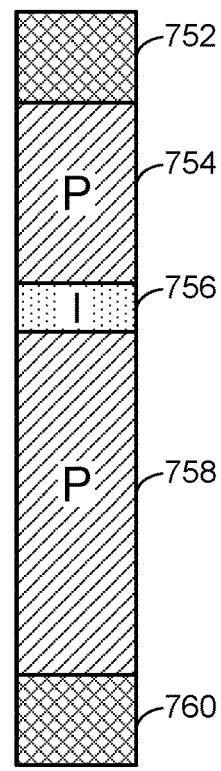
Figure 7G:
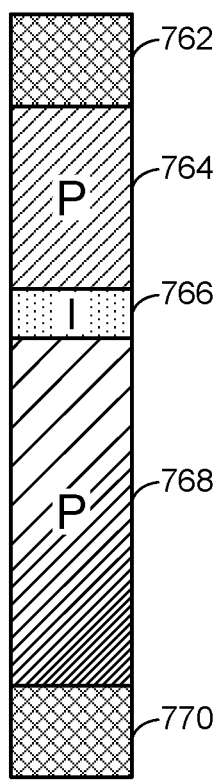
Figure 7H:
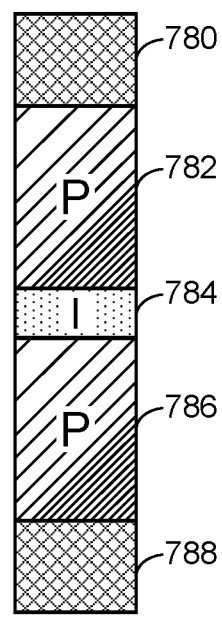
Figure 7I:
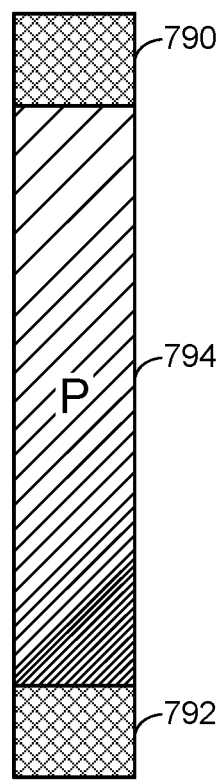

FIGS. 7D and 7E illustrate an example of how asymmetric operation may be introduced in an IPI device. FIG. 7D shows a CES device comprising equally formed intrinsic regions 734 and 738 separated by a P-type doped region 736. As shown in FIG. 7E, asymmetric set or reset voltage or current conditions may be introduced by replacing intrinsic region 738 with a P or P+ doped region 748. Additionally, asymmetric operation may be introduced by using asymmetric dimensions and/or asymmetric doping as illustrated in FIGS. 7F through 7I. In the CES device shown FIG. 7F, for example, an asymmetric size of P-type doped portions 754 and 758 separated by intrinsic region 756 may introduce asymmetries. This may be further altered by introducing gradient in a concentration of P-type doping as illustrated in FIG. 7G. Here, a concentration of P-type doping in region 768 is highest toward terminal 770 and lowest toward intrinsic region 766 according to a gradient. In FIG. 7H, P-type doped regions 782 and 786 may be the same dimensions. However, asymmetry of set or reset voltage or current conditions may be introduced by introduced by applying a gradient to a concentration in P-type doping in regions 782 and 786. As shown, a higher P-type doping concentration in region 782 occurs toward intrinsic region 784 and a lower P-type doping concentration occurs toward terminal 780, and a higher P-type concentration in region 786 occurs toward terminal 788 and a lower P-type doping concentration occurs toward intrinsic region 784. FIG. 7I shows a single P-type doped region 794 between terminals 790 and 792. A P-type doping concentration gradient provides a highest concentration toward terminal 792 and a lowest P-type doping concentration toward terminal 790.

As described previously, in an embodiment, a voltage may be applied to a CEM of a CES device. Also, in an embodiment, at least one of a current density and/or a current within the CEM may be measured, and an impedance state of the CES dependent on the measured current and/or current density may be determined. In an embodiment, the impedance state may be dependent on a combination of a capacitance and a resistance of the CEM. Further, in an embodiment, the impedance state may comprise one of a plurality of impedance states, wherein a first of the plurality of impedance states has a lower impedance than a second of the plurality of impedance states. In an embodiment, the first impedance state may have a lower resistance and a lower capacitance, and the second impedance state may have a higher resistance and a higher capacitance. Additionally, in an embodiment, a ratio of impedances of the plurality of impedance states may be proportional to a physical property of the CEM. The physical property of the CEM may include, for example, a Thomas Fermi screening length and/or a Bohr radius. Also, in an embodiment, individual impedance states of the plurality of impedance states may be associated with a data value. Further, a difference in current between the first impedance state and the second impedance state at a determined voltage may provide an indication of a read window, in an embodiment.

As also described previously, in an embodiment, a plurality of electrons may be provided to a CEM of a CES device such that the CES enters a first impedance state, and a plurality of holes may be provided to the CEM such that the CES enters a second impedance state. Also, in an embodiment, the plurality of electrons may cause a voltage across the CEM to be greater than a set voltage condition, and the plurality of holes may cause the voltage across the CEM to be equal to or greater than a reset voltage condition. Additionally, the voltage across the CEM may cause a current density in the CEM to be equal to or greater than a set current density and/or a set current condition, and the voltage across the CEM may cause the current density in the CEM to be equal to or greater than a reset current density and/or a reset current, in an embodiment. Further, in an embodiment, a set voltage across the CEM and a set current density through the CEM may be exceeded, and a reset voltage across the CEM and a reset current density through the CEM may be exceeded, in an embodiment. Also, in an embodiment, individual impedance states may be associated with a data value. Additionally, at least one of the reset voltage, the set voltage, and a difference between the set voltage and the reset voltage may be proportional to a physical property of the CEM, wherein the physical property of the CEM may include at least one of a strong electron potential due to localization and/or a correlation of the electrons, in an embodiment. Further, in an embodiment, the difference between the set voltage and the reset voltage may provide an indication of a size of at least one of a write window and/or a programming window.

In a further embodiment, as described previously, a plurality of electrons may be provided to a CEM of a CES device such that a current and/or current density within the CEM exceeds a first threshold and a voltage across the CEM exceeds a second threshold. Further, in an embodiment, switching from a first impedance state to a second impedance state may result from the current and/or current density exceeding the second threshold. The first impedance state may have a higher resistance and a higher capacitance, and the second impedance state has a lower resistance and a lower capacitance, in an embodiment. Additionally, the first threshold may be dependent on at least one of a current and/or current density required to enable a Mott transition in the CEM, a voltage required to inject electrons over a metal insulator barrier within the CEM, and/or a voltage greater or equal to twice the band-splitting potential, in an embodiment.

An another embodiment, a plurality of electrons may be provided to a CEM of a CES device such that a concentration of electrons within the CEM exceeds a threshold, and a switching from a first impedance state to a second impedance state may occur as a result of the concentration of electrons exceeding the threshold for a Mott transition. Further, in an embodiment, at least one of the plurality of electrons may be recombined with at least one of a plurality of holes within the CEM to enable the switching from the first impedance state to the second impedance state. In an embodiment, the concentration of the plurality of electrons and/or holes may be dependent at least in part on at least one physical property associated with the CEM. The at least one physical property may include, for example the Bohr radius. Further, in an embodiment, the threshold may be dependent at least in part on a current and/or current density required to enable the Mott transition. Also, in an embodiment, a resistance and/or capacitance (or impedance) of the CEM may be substantially different, such as a result of the Mott transition, for example. Additionally, a switching from the first impedance state to the second impedance state may be caused by a disproportionation reaction, in an embodiment.

As discussed above, a CEM of a CES device may be provided with a plurality of holes such that a concentration of holes within the CEM exceeds a threshold, and switching from a first impedance state to a second impedance state may occur as a result of the concentration of holes exceeding the threshold, in an embodiment. The first impedance state may comprise a lower resistance, lower capacitance state, and the second impedance state may comprise a higher resistance, higher capacitance state, for example. Also, in an embodiment, the threshold may depend, at least in part, on at least one of a current and/or current density required to enable a Mott-like transition within the CEM, and/or a voltage greater or equal to the band-splitting potential. Additionally, in an embodiment, the threshold may be dependent on a current and/or currently density required to enable a Mott-like transition. In an embodiment, at least one of the plurality of holes may be recombined with a respective at least one of a plurality of electrons within the CEM to enable switching from the first impedance state to the second impedance state. Also, a concentration of the plurality of electrons and/or holes may be dependent at least in part on at least one physical property associated with the CEM. The at least one physical property may include, for example, a Thomas Fermi screening length. Further, in an embodiment, the switching from the first impedance state to the second impedance state may be caused by a disproportionation reaction. Also, in an embodiment, resistance and/or capacitance of the CEM may be substantially different, such as between the first impedance state and the second impedance state, for example.

As also discussed previously, a variable impeder device may comprise a CEM capable of operating in a first impedance state and a second impedance state. In an embodiment, the first impedance state may comprise a lower resistance, lower capacitance state, and the second impedance state may comprise a higher resistance, higher capacitance state. Also, in an embodiment, a change in the capacitance may be dependent on at least one material property associated with the CEM. In an embodiment, the CEM may comprises one or more of: one or more transition metal oxides, one or more rare earth oxides, one or more oxides of one or more f-block elements of the periodic table, one or more rare earth transitional metal oxide perovskites, yttrium, and/or ytterbium. Additionally, in an embodiment, a transition from the first impedance state to the second impedance state of the variable impeder device may depend at least in part on an applied critical bias and a critical current/current density.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method comprising:
   applying a first programming signal to first and second terminals of a correlated electron switch (CES) device to meet a first voltage condition or a first current condition, or a combination thereof, for placement of the CES device in a first impedance state, wherein the CES device comprises one or more layers of a correlated electron material (CEM) disposed between the first and second terminals;

applying a second programming signal to first and second terminals of the CES device to place the CES device in a second impedance state; and applying a third programming signal to first and second terminals of the CES device to meet a second voltage condition or a second current condition, or a combination thereof, for placement of the CES device in the first impedance state, wherein a polarity of the first voltage condition is opposite a polarity of the second voltage condition, and a polarity of the first current condition is opposite a polarity of the second current condition, and wherein a difference in a magnitude of the first voltage condition and a magnitude of the second voltage condition or a difference in a magnitude of the first current condition and a magnitude of the second current condition, or any combination thereof, is responsive at least in part to a non-uniform application of a dopant to the one or more layers of the CEM disposed between the first and second terminals.

2. The method of claim 1, wherein the first impedance state comprises a conductive or low impedance state and the second impedance state comprises an insulative or low impedance state, and wherein the first programming signal is applied in a first set operation, the second programming signal is applied in a reset operation and the third programming signal is applied in a second set operation.

3. The method of claim 2, wherein the first set operation is characterized by a first set voltage condition and the second set operation is characterized by a second set voltage condition, and wherein a magnitude of the first set voltage condition is greater than a magnitude of the second set voltage condition.

4. The method of claim 2, wherein the first set operation is characterized by a first set current condition and the second set operation is characterized by a second set current condition, and wherein a magnitude of the first set current condition is greater than a magnitude of the second set current condition.

5. The method of claim 2, wherein application of the first programming signal to the first and second terminals of the CES device and application of the third programming signal to the first and second terminals of the CES device comprise injection of electrons in the CEM to achieve a sufficient concentration of electrons in the CEM to place the CES device in the conductive or low impedance state.

6. The method of claim 1, wherein the first impedance state comprises an insulative or high impedance state and the second impedance state comprises a conductive or low impedance state, and wherein first programming signal is applied in a first reset operation, the second programming signal is applied in a set operation and the third programming signal is applied in a second reset operation.

7. The method of claim 1, wherein the CES device is placed in the first impedance state or the second impedance state based, at least in part, on a localization of electrons in the CEM.

8. The method of claim 1, wherein the CES device comprises a non-volatile memory device.

9. The method of claim 1, wherein a majority a contiguous portion of the CEM is switchable between a conductive or low impedance state and an insulative or high impedance state to place the CES device in either the first impedance state or the second impedance state.

10. The method of claim 9, wherein a majority a contiguous portion of the CEM is switchable between the conductive or low impedance state and the insulative or high impedance state responsive to a Mott transition.

11. The method of claim 9, wherein the CEM comprises a transition metal oxide that is non-uniformly doped with an extrinsic ligand.

12. The method of claim 1, wherein the CES device comprises a variable impeder device, and wherein the first impedance state imparts a first capacitance value and the second impedance state imparts a second capacitance value.

13. The method of claim 1, wherein the one or more layers of the CEM comprise one or more contiguous layers of the CEM, and wherein the one or more contiguous layers of the CEM further comprises at least one layer of intrinsic CEM and one or more doped layers of CEM.

14. The method of claim 1, wherein the one or more layers of the CEM comprise one or more contiguous layers of the CEM, and wherein the one or more contiguous layers of CEM comprise at least an intrinsic layer of CEM formed between an N-type doped layer of CEM and a P-type doped layer of CEM.

15. The method of claim 1, wherein the one or more layers of the CEM comprise one or more contiguous layers of the CEM, and wherein the one or more contiguous layers of the CEM comprise at least an intrinsic layer of CEM formed between a first P-type doped layer of CEM and a second P-type doped layer of CEM, wherein a thickness of the first P-type doped layer of CEM is greater than a thickness of the second P-type doped layer of CEM.

\* \* \* \* \*